United States Patent
Wang et al.

(10) Patent No.: US 8,343,276 B2
(45) Date of Patent: Jan. 1, 2013

(54) HIGH-TEMPERATURE IONIC STATE COMPOUND CRYSTALLIZATION TECHNOLOGY

(76) Inventors: Haibiao Wang, Shanghai (CN); Tetsunori Kunimune, Los Angeles, CA (US); Cecilia Wang, Shanghai (CN)

( * ) Notice: Subject to any disclaimer, the term of this patent is extended or adjusted under 35 U.S.C. 154(b) by 867 days.

(21) Appl. No.: 12/487,625

(22) Filed: Jun. 18, 2009

(65) Prior Publication Data

US 2010/0320075 A1     Dec. 23, 2010

(51) Int. Cl.
C30B 23/00     (2006.01)
C30B 25/00     (2006.01)
C30B 28/12     (2006.01)
C30B 28/14     (2006.01)
C30B 35/00     (2006.01)
C30B 11/00     (2006.01)

(52) U.S. Cl. .......... 117/200; 117/84; 117/204; 117/206
(58) Field of Classification Search .............. 117/84, 117/200, 204, 206
See application file for complete search history.

(56) References Cited

U.S. PATENT DOCUMENTS

| | | | | |
|---|---|---|---|---|
| 4,609,402 | A * | 9/1986 | McMasters | 75/10.11 |
| 5,863,601 | A * | 1/1999 | Kikuchi et al. | 427/200 |
| 7,465,822 | B2 * | 12/2008 | Cheung et al. | 560/232 |
| 7,985,188 | B2 * | 7/2011 | Felts et al. | 600/573 |

* cited by examiner

*Primary Examiner* — James McDonough

(57) ABSTRACT

The present invention provides a high-temperature ionic state fluidized bed compound crystallization technology and an internal reactor structure thereof. The principle of the present invention is that reaction gas is effected by a group of high-frequency external magnetic fields and forms the high-temperature gaseous ion in the first quartz vacuum tube, then forms ion deposition diffusion in the second quartz vacuum tube preheated at constant temperature. As a result, other high-temperature gaseous ions except the silicon hydride are decomposed, rapidly deposited and crystallized in the ion diffusion chamber. And the un-decomposed silicon hydride gas is directly poured into the surface of the silicon heating body of the compound fluidized bed by the static negative high-voltage quartz spray hole to decompose and crystallize, or crystallize by a way of fluid state in the arched heating quartz tube communicating with the top of two quartz reaction furnaces.

16 Claims, 6 Drawing Sheets

HIGH-TEMPERATURE IONIC STATE COMPOUND CRYSTALLIZATION TECHNOLOGY

BACKGROUND OF THE PRESENT INVENTION

1. Field of Invention

The present invention relates to a crystallization technology, and more particularly to a high-temperature ionic state compound crystallization technology, wherein the depurated 6N silicon hydride electron gas ($SiH_4$) continuously products high purity polycrystalline silicon (6N-8N) in fluidized bed compound crystallization reaction furnace after high temperature ionic state pre-decomposition.

2. Description of Related Arts

A conventional fluidized bed has some shortcomings such as much silicon powder, low purity of the crystallization, and low productivity. Compared to the conventional fluidized bed, the present invention is a combination of the dynamic crystallization method and fixed crystalline rods method so as to reduce significantly silicon powder, improve the purity of the crystallization, and crystallize on silicon rod at the same time to increase production.

Accordingly, the present invention provides a high-temperature ionic state fluidized bed compound crystallization technology and an internal reactor structure thereof, which is completely different from the former conventional reduction reaction furnaces (including CVD reducing furnaces made of metal or quartz).

SUMMARY OF THE PRESENT INVENTION

An object of the present invention is to provide a high-temperature ionic state compound crystallization technology, wherein the depurated 6N silicon hydride electron gas ($SiH_4$) continuously products high purity polycrystalline silicon (6N-8N) in fluidized bed compound crystallization reaction furnace after high temperature ionic state pre-decomposition.

Another object of the present invention is to provide a high-temperature ionic state compound crystallization technology, which is a combination of the dynamic crystallization method and the fixed crystalline rods method so as to reduce significantly silicon powder, improve the purity of the crystallization, and crystallize on the silicon rod at the same time to increase production.

Another object of the present invention is to provide a compound crystallization system with low power consumption and high efficiency.

Accordingly, in order to accomplish the above objects, the present invention provides a compound crystallization system, comprising:

a radio frequency magnetic field high-temperature ion diffusion unit, having an ion diffusion chamber, which comprises a first quartz vacuum prefabricated tube, a second quartz vacuum prefabricated tube, a group of external high-frequency field coils encircling a peripheral surface of the first quartz vacuum prefabricated tube, a quartz heater provided outside the first quartz vacuum prefabricated tube, and two flange valves provided at a top of the first and second quartz vacuum prefabricated tubes respectively;

a compound fluidized bed comprising:

two high-temperature quartz reaction furnaces provided within the high-temperature ion diffusion unit;

an arched quartz heating tube communicating with a top of the two high-temperature quartz reaction furnaces;

two silicon electrode heating bodies provided within the two reaction furnaces respectively; and two cylindrical stainless steel fixed flanges sealedly provided at a bottom of the two reaction furnaces, respectively, wherein each of the fixed flanges has an air inlet, an air outlet and a high-speed current wave impact hole for Ar, $H_2$ separately located at a peripheral inner of the fixed flange respectively;

an active stainless steel center flange comprising 4-6 pairs of electrodes, a high-temperature ceramic sealed cartridge, a water-cooled sealed room and sealed hydraulic elevator; and a vacuum material room provided below the cylindrical stainless steel fixed flange, wherein the active stainless steel center flange is provided within the vacuum material room, whereby reaction gas is effected by a group of high-frequency external magnetic fields and forms the high-temperature gaseous ion in the first quartz vacuum tube, then forms ion deposition diffusion in the second quartz vacuum tube preheated at constant temperature, in such a manner that other high-temperature gaseous ions except the silicon hydride are decomposed, rapidly deposited and crystallized in the ion diffusion chamber, and the un-decomposed silicon hydride gas is directly poured into a surface of the silicon heating body of the compound fluidized bed to decompose and crystallize, or crystallize by a way of fluid state in the arched heating quartz tube communicating with the top of the two quartz reaction furnaces.

These and other objectives, features, and advantages of the present invention will become apparent from the following detailed description, the accompanying drawings, and the appended claims.

DETAILED DESCRIPTION OF THE PREFERRED EMBODIMENT

The present invention provides a high-temperature ionic state fluidized bed compound crystallization technology and an internal reactor structure thereof, which is completely different from the former conventional reduction reaction furnaces (including CVD reducing furnaces made of metal or quartz).

Figure 1:
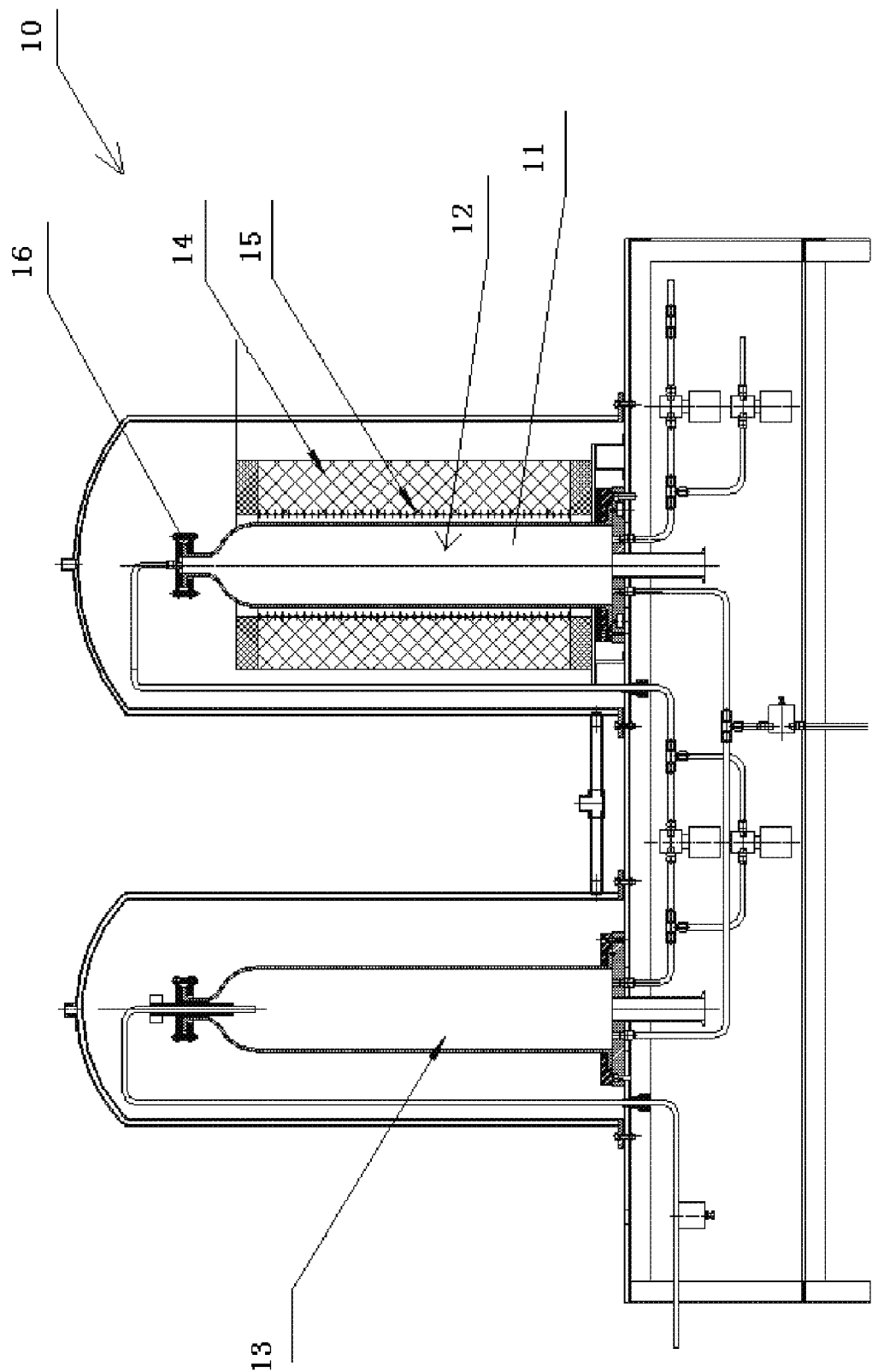
FIG. 1 is a perspective view of a compound crystallization system according to a preferred embodiment of the present invention.

Referring to FIG. 1 of the drawings, a compound crystallization system according to a preferred embodiment of the present invention is illustrated.

The principle of the present invention is that: reaction gas (silicon hydride) is effected by a group of high-frequency external magnetic fields and forms the high-temperature gaseous ion in the first quartz vacuum tube, then forms ion deposition diffusion in the second quartz vacuum tube preheated at constant temperature. As a result, other high-temperature gaseous ions except the silicon hydride are decomposed, rapidly deposited and crystallized in the ion diffusion chamber. And the un-decomposed silicon hydride gas is directly poured into the surface of the silicon heating body of the compound fluidized bed by the static negative high-voltage quartz spray hole to decompose and crystallize, or crystallize by a way of fluid state in the arched heating quartz tube communicating with the top of two quartz reaction furnaces.

A radio frequency (RF) magnetic field high-temperature ion diffusion unit 10, having an ion diffusion chamber 11, comprises a first quartz vacuum prefabricated tube 12, a second quartz vacuum prefabricated tube 13, a group of external high-frequency field coils 14 (1-5 KV, 13.5 MHz, 0.5-1 KW) encircling a peripheral surface of the first quartz vacuum prefabricated tube 12, a quartz heater 15 provided outside the first quartz vacuum prefabricated tube 12, and two flange valves 16 provided at a top of the first and second quartz vacuum prefabricated tubes 12, 13 respectively.

Accordingly, an inner diameter of both the first and second quartz vacuum prefabricated tubes 12, 13 is in the range of 15-25 cm, a thickness of which is 0.8-1.0 cm, a height of which is 50-80 cm, a heating temperature of which remains at 380° C., as shown in FIG. 1.

Figure 2:
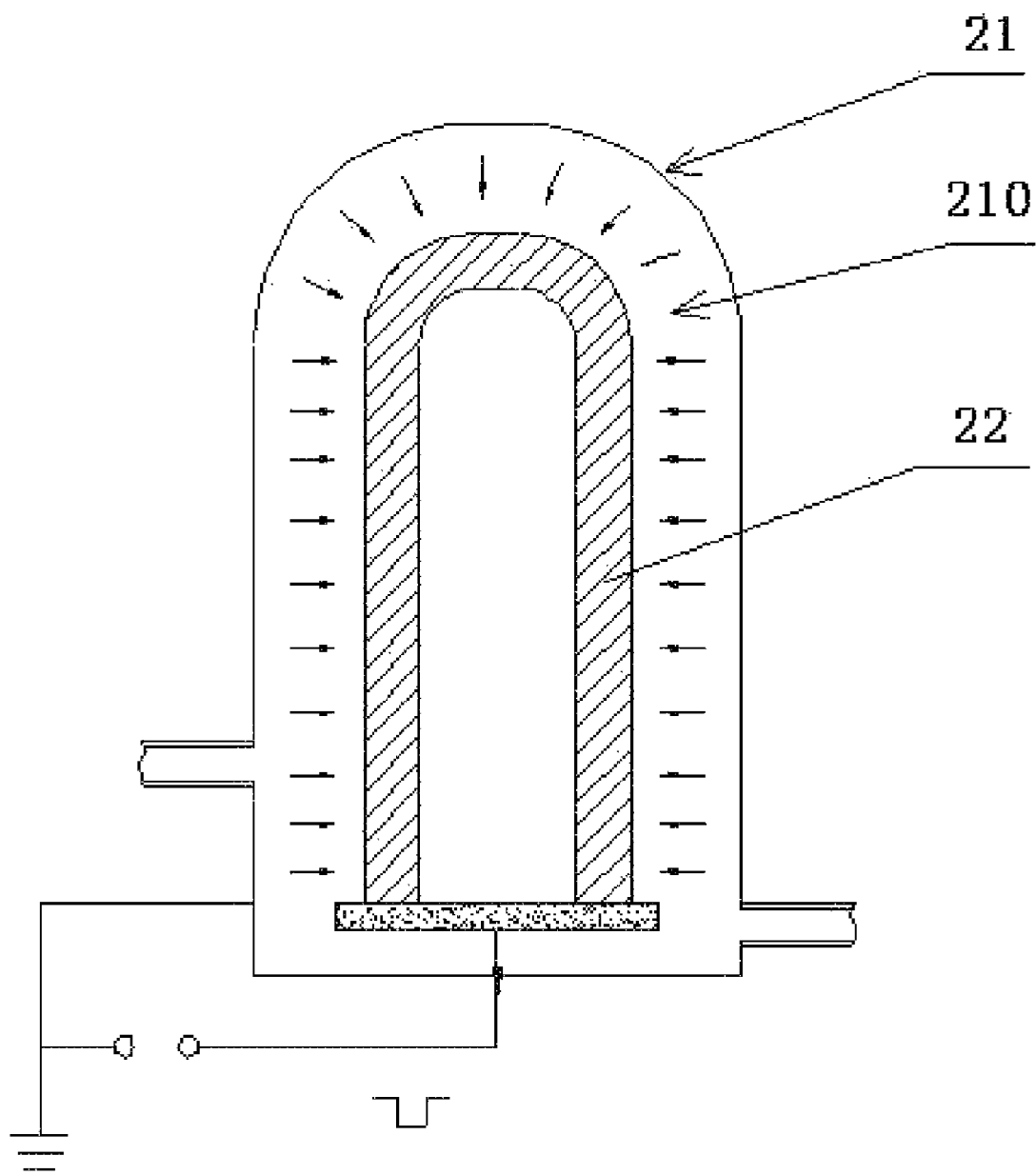
FIG. 2 is a partially perspective view of a compound fluidized bed according to the above preferred embodiment of the present invention.

The quartz high-temperature magnetic field ion diffusion unit 10 is provided outside a high-temperature quartz reaction furnace 21. The silicon hydride gas is directly poured into the reaction furnaces 21 or onto the surface of the silicon electrode heating body 22 to crystallize by a quartz spray hole. As shown in FIG. 2.

Figure 3:
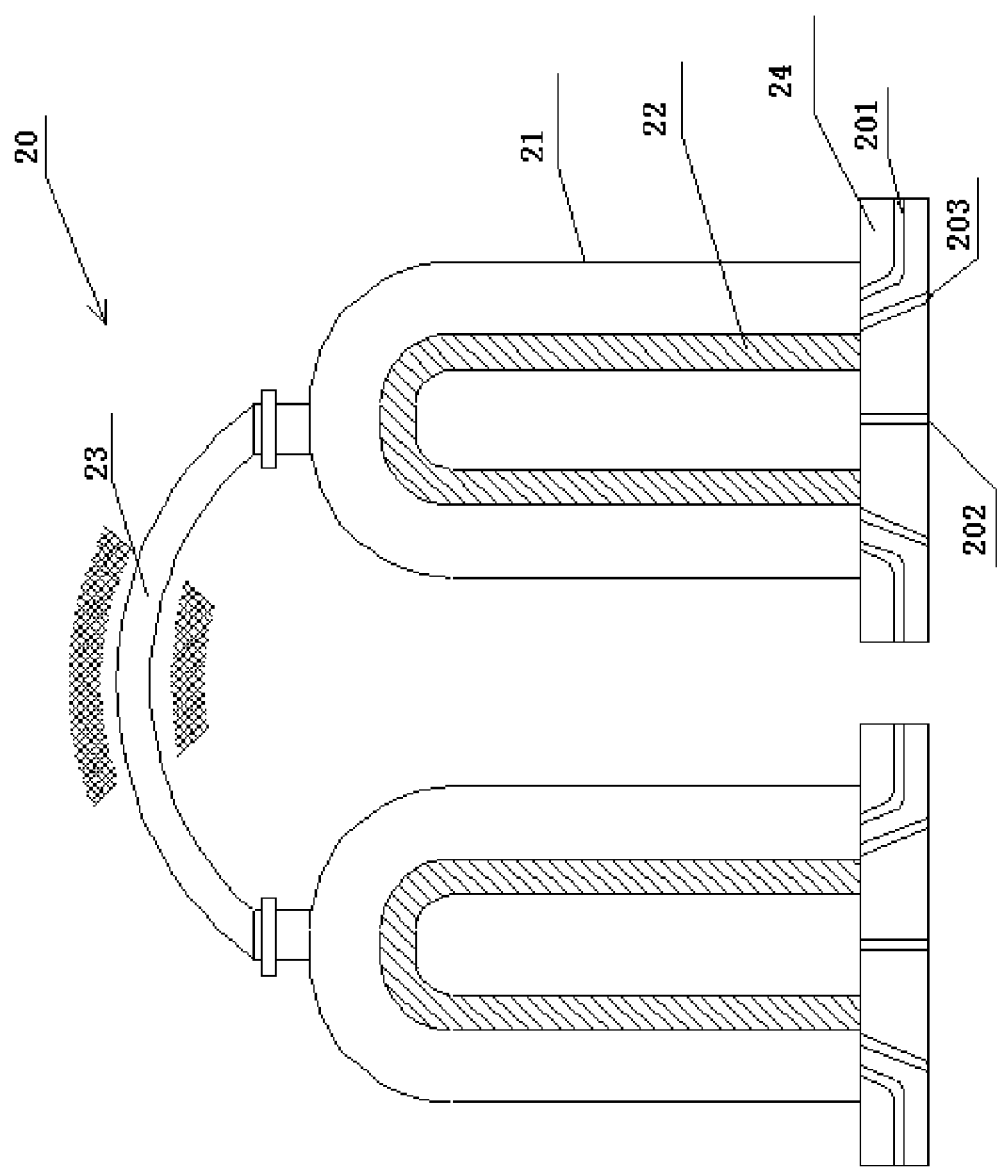
FIG. 3 is a perspective view of the compound fluidized bed according to the above preferred embodiment of the present invention.

A compound fluidized bed 20 comprises two high-temperature quartz reaction furnaces 21, and an arched quartz heating tube 23 communicating with the top of the two high-temperature quartz reaction furnaces 21, wherein an air inlet 201, an air outlet 202 and a high-speed current wave impact hole 203 for Ar, $H_2$ are provided at the bottom of each of the two high-temperature quartz reaction furnaces 21, as shown in FIG. 3. (A temperature of the arched quartz heating tube 23 is in the range of 680-780° C. If the temperature is too high, it is easy to cause amorphous crystallization.)

Accordingly, a diameter of the air inlet 201, the air outlet 202 and the high-speed current wave impact hole 203 for Ar, $H_2$ is 15-50 mm in general, respectively, each of which is made of purified stainless steel, and each of which is separately located at a peripheral inner of the cylindrical stainless steel fixed flange 24, and each of which is controlled by a specific air-operated high-temperature ball valve, such as an air inlet ball valve 2010, an air outlet ball valve 2020, wherein the cylindrical stainless steel fixed flange 24 is provided at the bottom of each of the reaction furnaces 21.

The convection of 6N pure argon ion and pure hydrogen at high speed forms a turbulent flow, so that the silicon hydride gas is crystallized to be a minimal granular crystallization by a way of fluid state in the reaction furnaces 21, or crystallized rapidly at the surface of the silicon heating body 22 to enhance obviously the output ability. (Usually the best density ratio of E-silane gas in the reaction furnace and 6N pure hydrogen, argon gas is in the range of 1:10-1:20.)

Figure 4:
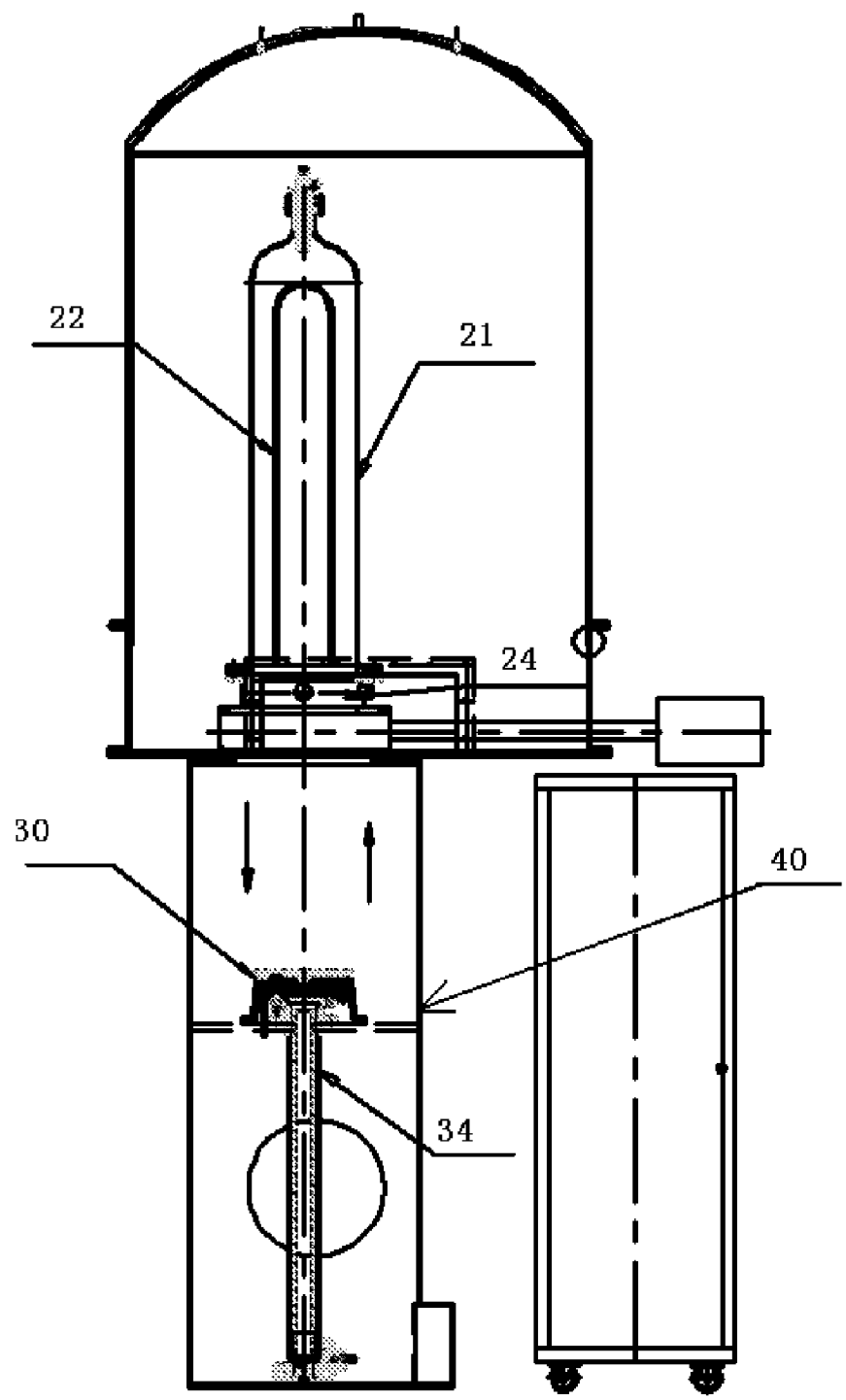
FIG. 4 is a perspective view of a high-temperature quartz reaction furnace and base material-taking room according to the above preferred embodiment of the present invention.
Figure 5:
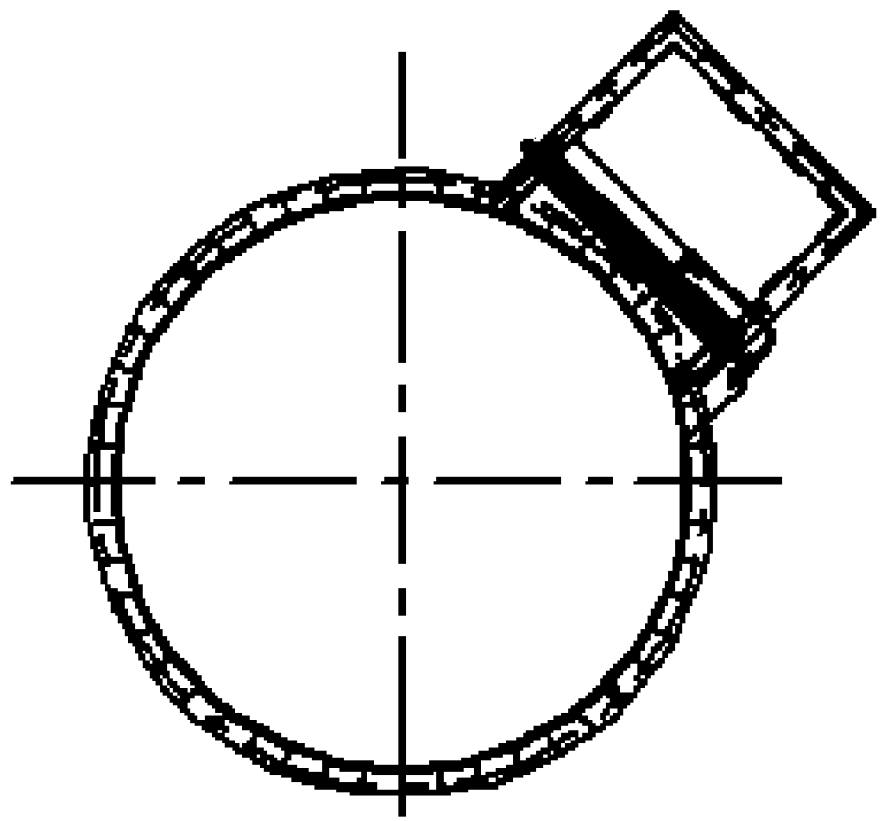
FIG. 5 is a paritally sectional view as shown in FIG. 4.

Each of the high-temperature quartz reaction furnaces 21, having a vacuum chamber 210, is a transparent high-temperature quartz bell jar shape, a diameter of which is 50-80 cm, a height of which is 125 cm, a width of which is 0.8-1.2 cm. The cylindrical stainless steel fixed flange 24 is sealedly provided at the bottom of each of the reaction furnaces 21. An active stainless steel center flange 30, and a vacuum material room 40 is provided below the cylindrical stainless steel fixed flange 24, as shown in FIG. 4.

Accordingly, an inner diameter of the cylindrical stainless steel fixed flange 24, which is provided at the bottom of each of the high-temperature quartz reaction furnaces 21, is the same as that of the high-temperature quartz vacuum chamber 210, an outer diameter of cylindrical stainless steel fixed flange 24 is larger than that of the high-temperature quartz vacuum chamber 210, and a height of cylindrical stainless steel fixed flange 24 is in the range of 15-35 cm in general.

Figure 6:
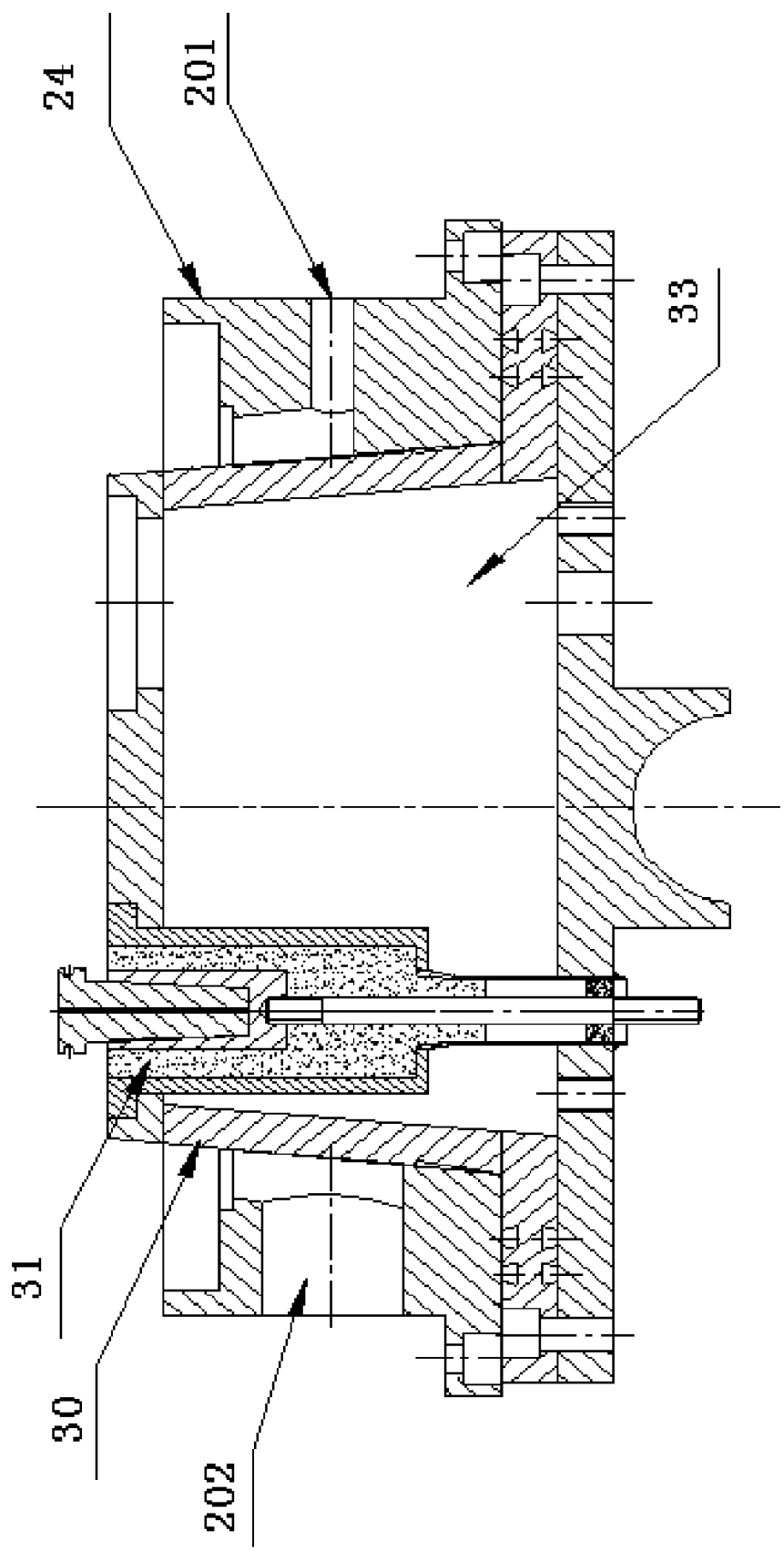
FIG. 6 is a sectional view of an electrode heating body and a water-cooled stainless steel flange according to the above preferred embodiment of the present invention.

A diameter of the active stainless steel center flange 30 is the same as that of the high-temperature quartz vacuum chamber 210, a height of the active stainless steel center flange 30 is in the range of 15-35 cm in general. The active stainless steel center flange 30 comprises 4-6 pairs of electrodes 31 (with a heating electric power of 10-35V, 100-400 A), a high-temperature ceramic sealed cartridge 32, a water-cooled sealed room 33 and a sealed hydraulic elevator 34. As shown in FIG. 6.

The traditional Siemens reaction furnace takes materials by promoting the cauldron, but the present invention takes materials from the base of the reaction furnace. In this way, we do not need to promote the furnace body, but depend on the lifting or shifting of the active stainless steel center flange 30 within the material room 40 instead to automatically take and charge the materials.

The advantage of this way of taking materials lies in optimizing the structure performance of the reaction furnace (wherein the vacuum leak rate remains always lower than 0.01 Pa/h), avoiding or eliminating external interferences and air pollution, reducing the production cycle, realizing continuously replacing stationary crystal-bar without break. Simultaneously, the present invention may also convert to a means of fluidized bed molecule crystallization. Therefore, the present invention has an obvious technical superiority and an application value in this field both at home and abroad.

A process of charging materials comprises the steps of: testing and sealing up the active stainless steel center flange 30 within the material room 40 before entering the material room 40; sweeping nitrogen and argon into the top and the bottom chamber separately in order to discharge the residual gas and the dust in the quartz vacuum chamber or vacuum material room; and pulling out the vacuum over and over again (to achieve 0.1-0.5 Pa) to avoid sufficiently the air or the moisture cross contaminating the quartz vacuum cavity.

A process of taking materials comprises the steps of: lowering the active stainless steel center flange; shifting rotatedly along a concentric axis of a base; and lifting automatically another active stainless steel center flange (equipped with the electrode heating body) to the crystallization position of the high-temperature quartz reaction furnace.

A process of treating the inner wall of the high-temperature quartz reaction furnace comprises the steps of: spraying evenly a layer of pure anti-ion septum $Si_3N_4$ on the inner wall of the quartz reaction furnace; and cooling by cold water circulation for remaining the temperature of the outer wall of the quartz reaction furnace lower than 150-450° C. so as to avoid changing the physicochemical characteristics of quartz at too high temperature to prevent the crystallization from ion sputtering pollution.

During the crystallization process, through the temperature pressure sensor in the reaction furnace and PLC industry control system, it automatically starts such as the high-temperature switch ball valves for air inlet and outlet according to the computer program. The starting procedure comprises the steps of: discharging the residual gas from the reaction furnace at first; and turning off the air outlet ball valves and turning on the air inlet when the pressure of high-temperature reaction furnace drops to a value that is basically balanced with that of the recovery tower (0.1-0.5 mmHg).

When the charged pressure ($SiH_4$) of the reaction furnace returns to the range of 1.25-2.25 mmHg, it automatically shuts off the air inlet ball valve. The security threshold generally is set that the switch control interval is 1-2 times/min. Circulating like this, a crystal production cycle is basically completed for 24-48 hours (generally speaking, the growth diameter of polycrystalline silicon stick is 10-15 cm, the purity of polycrystalline silicon stick is 6N-8N, and the average power consumption is 10-15 KWh/kg).

All in all, the present invention is a combination of the dynamic crystallization method and fixed crystalline rods method. Compared to the conventional fluidized bed, it reduces significantly silicon powder, improves the purity of the crystallization, and crystallizes on the silicon rod at the same time to increase production.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A compound crystallization system, comprising:
    a radio frequency magnetic field high-temperature ion diffusion unit, having an ion diffusion chamber, which comprises a first quartz vacuum prefabricated tube, a second quartz vacuum prefabricated tube, a group of external high-frequency field coils encircling a peripheral surface of said first quartz vacuum prefabricated tube, a quartz heater provided outside said first quartz vacuum prefabricated tube, and two flange valves provided at a top of said first and second quartz vacuum prefabricated tubes respectively;
    a compound fluidized bed comprising:
        two high-temperature quartz reaction furnaces provided within said high-temperature ion diffusion unit;
        an arched quartz heating tube communicating with a top of said two high-temperature quartz reaction furnaces;
        two silicon electrode heating bodies provided within said two reaction furnaces respectively; and
        two cylindrical stainless steel fixed flanges sealedly provided at a bottom of said two reaction furnaces, respectively, wherein each of said fixed flanges has an air inlet, an air outlet and a high-speed current wave impact hole for Ar, $H_2$ separately located at a peripheral inner of said fixed flange respectively;
    an active stainless steel center flange comprising 4-6 pairs of electrodes, a high-temperature ceramic sealed cartridge, a water-cooled sealed room and sealed hydraulic elevator; and
    a vacuum material room provided below said cylindrical stainless steel fixed flange, wherein said active stainless steel center flange is provided within said vacuum material room,
    whereby reaction gas is effected by a group of high-frequency external magnetic fields and forms the high-temperature gaseous ion in said first quartz vacuum tube, then forms ion deposition diffusion in said second quartz vacuum tube preheated at constant temperature, in such a manner that other high-temperature gaseous ions except the silicon hydride are decomposed, rapidly deposited and crystallized in said ion diffusion chamber, and the un-decomposed silicon hydride gas is directly poured into a surface of said silicon heating body of said compound fluidized bed to decompose and crystallize, or crystallize by a way of fluid state in said arched heating quartz tube communicating with the top of said two quartz reaction furnaces.

2. The compound crystallization system, as recited in claim 1, wherein an inner diameter of said first and second quartz vacuum prefabricated tubes respectively is in the range of 15-25 cm, a thickness of which is 0.8-1.0 cm, a height of which is 50-80 cm, a heating temperature of which remains at 380° C.

3. The compound crystallization system, as recited in claim 2, wherein a temperature of said arched quartz heating tube is in the range of 680-780° C.

4. The compound crystallization system, as recited in claim 2, wherein a diameter of said air inlet, said air outlet and said high-speed current wave impact hole is 15-50 mm, respectively, each of which is made of purified stainless steel.

5. The compound crystallization system, as recited in claim 3, wherein a diameter of said air inlet, said air outlet and said high-speed current wave impact hole is 15-50 mm, respectively, each of which is made of purified stainless steel.

6. The compound crystallization system, as recited in claim 4, wherein the best density ratio of E-silane gas in each of said reaction furnaces and 6N pure hydrogen, argon gas is in the range of 1:10-1:20.

7. The compound crystallization system, as recited in claim 5, wherein the best density ratio of E-silane gas in each of said reaction furnaces and 6N pure hydrogen, argon gas is in the range of 1:10-1:20.

8. The compound crystallization system, as recited in claim 5, wherein each of said reaction furnaces, having a vacuum chamber, is a transparent high-temperature quartz bell jar shape, a diameter of which is 50-80 cm, a height of which is 125 cm, a width of which is 0.8-1.2 cm.

9. The compound crystallization system, as recited in claim 6, wherein each of said reaction furnaces, having a vacuum chamber, is a transparent high-temperature quartz bell jar shape, a diameter of which is 50-80 cm, a height of which is 125 cm, a width of which is 0.8-1.2 cm.

10. The compound crystallization system, as recited in claim 7, wherein each of said reaction furnaces, having a vacuum chamber, is a transparent high-temperature quartz bell jar shape, a diameter of which is 50-80 cm, a height of which is 125 cm, a width of which is 0.8-1.2 cm.

11. The compound crystallization system, as recited in claim 8, wherein an inner diameter of each of said fixed flanges is the same as that of said high-temperature quartz vacuum chamber, an outer diameter of each of said fixed flanges is larger than that of said high-temperature quartz vacuum chamber, and a height of each of said fixed flanges is in the range of 15-35 cm.

12. The compound crystallization system, as recited in claim 9, wherein an inner diameter of each of said fixed flanges is the same as that of said high-temperature quartz vacuum chamber, an outer diameter of each of said fixed flanges is larger than that of said high-temperature quartz vacuum chamber, and a height of each of said fixed flanges is in the range of 15-35 cm.

13. The compound crystallization system, as recited in claim 10, wherein an inner diameter of each of said fixed flanges is the same as that of said high-temperature quartz vacuum chamber, an outer diameter of each of said fixed flanges is larger than that of said high-temperature quartz vacuum chamber, and a height of each of said fixed flanges is in the range of 15-35 cm.

14. The compound crystallization system, as recited in claim 11, wherein a diameter of said active stainless steel center flange is the same as that of said high-temperature quartz vacuum chamber, a height of said active stainless steel center flange is in the range of 15-35 cm.

15. The compound crystallization system, as recited in claim 12, wherein a diameter of said active stainless steel center flange is the same as that of said high-temperature quartz vacuum chamber, a height of said active stainless steel center flange is in the range of 15-35 cm.

16. The compound crystallization system, as recited in claim 13, wherein a diameter of said active stainless steel center flange is the same as that of said high-temperature quartz vacuum chamber, a height of said active stainless steel center flange is in the range of 15-35 cm.

* * * * *